METHOD OF FABRICATING SEMICONDUCTOR DEVICES

Filed Dec. 13, 1966

INVENTOR
Andrew G.F. Dingwall
BY M. Y. Epstein
Attorney

United States Patent Office 3,437,533

Patented Apr. 8, 1969

3,437,533

METHOD OF FABRICATING SEMICONDUCTOR DEVICES

Andrew G. F. Dingwall, Bridgewater, N.J., assignor to Radio Corporation of America, a corporation of Delaware Filed Dec. 13, 1966, Ser. No. 601,479
Int. Cl. H01l 7/44
U.S. Cl. 148—187 5 Claims

ABSTRACT OF THE DISCLOSURE

A method of fabricating a semiconductor device by (1) providing a masking layer on a surface of a semiconductor wafer, the layer having randomly distributed pin holes, (2) selectively removing portions of the masking layer to expose the underlying wafer, (3) depositing a dopant source on the masking layer and the exposed wafer surface, including the pinholes, (4) selectively removing the source from all portions of the masking layer, including the pinholes, but not from the exposed wafer surface and (5) diffusing the dopant into the wafer from the source remaining on the exposed wafer surface.

Figure 1:
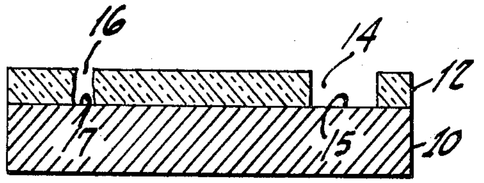
Figure 5:
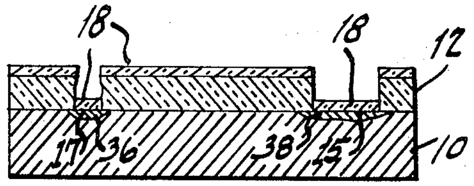

This invention relates to the fabrication of semiconductor devices, and particularly to the diffusion of conductivity modifiers into a body of semiconductor material.

In the fabrication of certain types of semiconductor devices, e.g. integrated circuits, it is the practice to form regions of different type conductivity within a semiconductor wafer by a combination of photolithographic, etching, and diffusion processes. That is, one surface of a semiconductor wafer is first coated with a diffusion masking layer, a photosensitive coating is applied onto the masking layer, and the photosensitive coating is exposed through a photomask. The unexposed portions of the photosensitive coating are then removed in a developing and fixing process, thereby uncovering portions of the masking layer, and the uncovered portions of the masking layer are then removed by an etching process. Thereafter, a conductivity modifier or dopant is diffused into the semiconductor wafer through the etched openings in the masking layer.

A problem that has long existed is that it has been all but impossible to provide masking layers which are completely solid and free of tiny holes, usually referred to as "pin holes," which extend entirely through the masking layer. In the diffusion process, the conductivity modifier passes into the wafer through the pin holes, thereby doping small portions of the wafer in a random, and often undesirable, manner.

An object of this invention is to provide a novel and improved method of fabricating semiconductor devices.

A further object of this invention is to provide a novel and improved method of diffusing a conductivity modifier into a semiconductor wafer wherein diffusion of the conductivity modifier into the wafer via pin holes through the masking layer is avoided.

For achieving these objects, a diffusion masking layer is first provided on the surface of a semiconductor wafer and an opening is made in the masking layer to selectively expose or uncover a surface portion of the wafer. Thereafter, a suitable source of dopant, such as a vapor of doped silicon dioxide, is deposited onto the wafer. The deposition process is preferably performed in such manner that the dopant remains on the wafer surface and does not diffuse into the wafer through the selectively opened surface portion of the wafer. Thereafter, the dopant source is removed from all portions of the wafer except the selectively opened portion thereof. In this process, the dopant source within any pin holes through the masking layer is also removed. Thereafter, the wafer is processed to cause the dopant in the unremoved dopant source covering the selectively opened portion of the wafer to diffuse into the wafer.

In the drawings:

FIGS. 1 through 8 are sectional views of a semiconductor wafer showing various steps in the processing thereof according to two embodiments of the present invention.

With reference to FIG. 1, a semiconductor wafer 10 is shown having a masking layer 12 thereon. In this embodiment, the wafer 10 comprises N-type silicon, and the masking layer 12 comprises silicon dioxide. Means for providing a layer of silicon dioxide, as well as other diffusion masking layers, such as silicon nitride, are known. In a preferred embodiment, the masking layer 12 comprises silicon dioxide which is "thermally" grown on the silicon wafer 10 to a depth in the order of 11,000 Angstroms. For example, a mixture of nitrogen and oxygen vapors is bubbled through a bottle of water heated to a temperature of 90° C., and the wafer 10 is heated in the resulting vapors at a temperature of 1200° C. for 2 hours.

As shown, the masking layer 12 has an opening or window 14 therethrough uncovering or exposing a portion 15 of the wafer surface. The opening 14 can be provided by any known means, such as by a first photolithographic and etching process of the type heretofore described.

As shown, the masking layer 12 has an undesired opening or pin hole 16 therethrough uncovering a portion 17 of the wafer surface. As known, the presence of such pin holes in masking layers is practically unavoidable.

Figure 2:
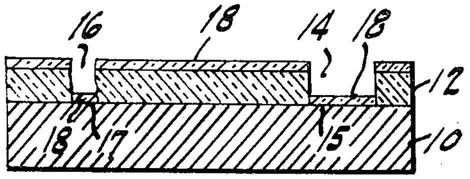
Figure 6:
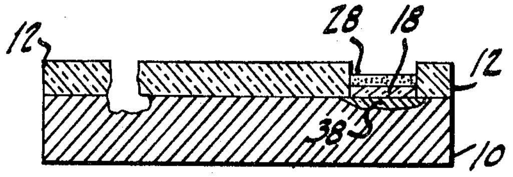
Figure 3:
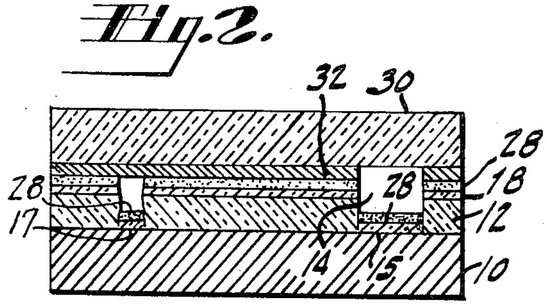

The wafer 10 is then coated, as shown in FIG. 2, with a layer 18 of a dopant source.

The dopant source layer 18 can comprise a dopant (i.e. conductivity modifier) itself, or a dopant combined with or carried in some manner by another medium. For example, dopants such as aluminum, arsenic, antimony, or the like can be provided on the wafer 10 as a layer 18 of the element itself. Dopants such as boron, phosphorous, or the like can be provided on the wafer as an oxide of these materials. Likewise, various dopants can be provided on the wafer as a layer of glass, e.g. boron in a borosilicate glass, phosphorous in a phosphorous silicate glass, or the like.

In a preferred embodiment, the doping source layer 18 comprises silicon dioxide doped with a dopant such as boron, aluminum, gallium, phosphorus, arsenic, antimony, or the like. The dopant used depends upon the conductivity type zone to be provided in the wafer.

Although not necessary, as described hereinafter, the dopant source layer is preferably provided by a process resulting in the dopant remaining on the surface of the wafer 10 and not diffusing, during the deposition process, into the wafer through the uncovered wafer portions 15 and 17. Generally, this is accomplished by providing the layer 18 by a process wherein the temperature of the wafer, and the duration of the process, are sufficiently low to cause little or no diffusion of the dopant into the wafer. With the exception of a dopant of aluminum, avoidance of diffusion of the dopant into the wafer can generally be accomplished using a deposition process wherein the wafer temperature does not exceed 500° C. and wherein the process lasts not more than 1 hour. With an aluminum dopant, the maximum wafer temperature is preferably below 300° C. Suitable processes for depositing each of the aforementioned dopant source layers are known. For example, a suitable process for applying a layer 18 of aluminum, arsenic, antimony, or the like comprises evaporation of these materials in vacuum. The wafer temperature can be maintained sufficiently low by controlling the rate at which the evaporation is carried out. Borosilicate and phosphorous silicate glasses or the like can be provided on the wafer at low wafer temperatures using known ion sputtering techniques. A layer of the various dopant oxides, such as the oxides of boron, phosphorous, silicon, or the like can be vapor deposited by reacting a compound of these materials with oxygen in the presence of the wafer. For example, a layer 18 of boron oxide can be obtained by reacting diborane ($B_2H_6$) with oxygen in a neutral atmosphere such as nitrogen or argon. The phosphorous oxide and silicon dioxide layers 18 likewise can be provided by reacting phosphine ($PH_3$) or silane ($SiH_4$), respectively, with oxygen. A doped layer 18 of silicon dioxide can be provided by adding a dopant source, such as phosphine or diborane, or the like, to the silane, and reacting the mixture with oxygen in the presence of the wafer, whereby a doped layer of silicon dioxide is formed. Likewise, a doped silicon nitride layer 18 can be formed by reacting silane with ammonia ($NH_3$) according to the following reaction:

$$4NH_3 + 3SiH_4 \xrightarrow{700^\circ \text{ C.}} Si_3N_4 + 12H_2$$

The silicon nitride vapor is cooled to a low temperature e.g. around 400° C., and the cooled vapor is mixed with a suitable dopant source, such as phosphine or diborane, or the like, and the vapor mixture is reacted with oxygen in the presence of the wafer.

Having provided the doping source layer 18 covering the entire wafer 10, as shown in FIG. 2, the layer 18 is removed from all portions of the wafer except the wafer portion 15 through which a diffusion of the dopant is eventually to be desired. The reason for the removal of portions of the layer 18 is that, as shown in FIG. 2, the dopant source layer 18 contacts not only the wafer portion 15 deliberately opened in the first photolithographic and etching process, but also contacts the wafer portion 17 uncovered by the pin hole 16. As known, the location of pin holes, such as the pin hole 16, is quite random, and diffusion of a dopant into the wafer via the pin holes often results in electrical shorting of various circuit elements of the device being fabricated.

To accomplish the selective removal of the dopant source layer 18, a second photolithographic and etching process is employed using a photomask having an image which is the negative of the image on the photomask used in the first photolithographic process. That is, with reference to FIG. 3, the wafer 10 is shown with the masking and dopant source layers 12 and 18, respectively, a photosensitive coating 28, such as Kodak Thin Film Resist (KTFR), on top of the layer 18, and a photomask 30 in contact with the surface of the photosensitive coating 28. The photomask 30 has an opaque image-forming element 32 covering the entire wafer 10 with the exception only of the wafer portion 15.

The portion of the photosensitive coating 28 covering the wafer portion 15 is then polymerized by a source of light through the photomask 30, and the photosensitive coating 28 is then developed and fixed in known fashion to remove all but the polymerized portion. The result of this shown in FIG. 4. As shown, only the portion 15 of the wafer previously opened in the first photolithographic-etching process is masked by the polymerized coating 28.

Thereafter, the unmasked portions of the dopant source layer 18 are removed, as by etching. Suitable etchants for removing the various dopant source layers 18 are known. See for example, "Printed and Integrated Circuitry, Materials and Processes" by T. D. Schlabach and D. K. Rider, McGraw-Hill, 1963. Boron oxide and phosphorous oxide can be selectively etched with hydrofluoric acid.

For the purpose of retaining the masking layer 12, as is often desired, an etchant can be selected which has little or no effect upon the masking layer, or (or both) the dopant source layer 18 is made thinner than the masking layer 12.

In one embodiment, for example, the masking layer 12 comprises a thermally grown layer of silicon dioxide having a thickness in the order of 11,000 Angstroms, and the dopant source layer 18 comprises a vapor deposited layer of doped silicon dioxide having a thickness in the order of 2,000 to 5,000 Angstroms. An etchant is used comprising, by weight, 8 parts ammonium fluoride, 2 parts hydrofluoric acid and 15 parts deionized water. This etchant attacks the vapor deposited silicon dioxide layer 18 at a rate approximately three times faster than it attacks the thermally grown silicon dioxide layer 12.

In another embodiment, the masking layer 12 comprises silicon nitride and the layer 18 comprises silicon dioxide. In this case, the above-described ammonium fluoride-hydrofluoric acid etchant can be used, the etchant having substantially no effect upon the silicon nitride layer 12.

Figure 7:
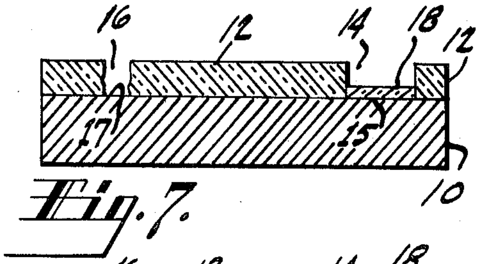
Figure 4:
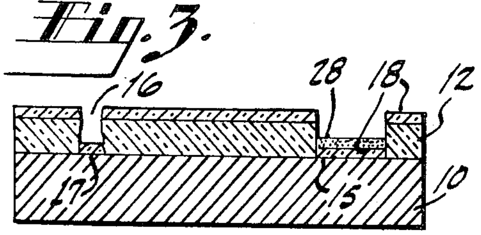
Figure 8:
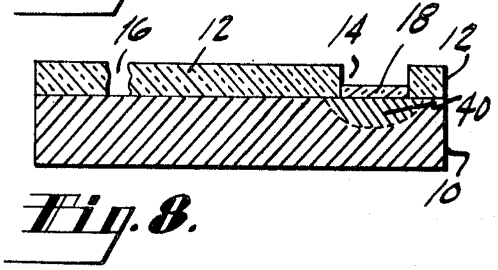

The result of the etching process is shown in FIG. 7. As shown, all of the dopant source layer 18, including the portion thereof within the pin hole 16, but excluding the portion of the layer 18 covering the selectively opened portion 15, has been removed. At this time, little or no diffusion of the dopant into the wafer has occurred.

As mentioned, although preferable, it is not necessary that diffusion of the dopant into the wafer be avoided during the dopant source layer 18 deposition process. That is, in one embodiment, shown in FIG. 5, diffusion of the dopant into the wafer 10 to form conductivity zones 36 and 38 occurs during the dopant source layer 18 deposition process. Means for accomplishing this are known. Thereafter, the dopant source layer 18 is selectively removed, as in the preferred embodiment, and an extra etching process is performed (FIG. 6) to etch away the portion 36 of the wafer 10 into which the undesired diffusion has taken place. For example, with a silicon wafer 10 having a thermally deposited silicon dioxide masking layer 12 and a vapor deposited silicon dioxide dopant source layer 28, an etchant comprising nitric acid and 1% hydrofluoric acid can be used which attacks silicon much faster than it attacks the silicon dioxide layers 12 and 18.

Returning now to the description of the preferred embodiment, after the selective removal of portions of the dopant source layer 18, the wafer 10 is treated to cause the dopant within the dopant source layer 18 to diffuse into the wafer 10 (FIG. 8) to form the conductivity zone 40. The processing used is determined by the particular dopant used, the desired concentration of the dopant within the wafer, and the depth of the diffusion. Suitable processing schedules are known. For example, to provide a P-type zone 40 having a depth of 100,000 Angstroms and a surface concentration of $5 \times 10^{20}$ atoms/cc., and using a dopant source layer 18 comprising silicon dioxide doped with 10%–20% boron, the wafer 10 is heated to a temperature of 1165° C., in nitrogen, for 16 hours. To provide an N-type zone 40 having a depth of 30,000 Angstroms, a surface concentration of $5 \times 10^{19}$ atoms/cc., and using a dopant source layer 18 comprising silicon dioxide doped with 1%–2% arsenic, the wafer is heated to 1250° C., in oxygen, for three hours.

In one series of tests using a wafer 10 having an area of three square centimeters, the average number of unwanted random diffusions into the wafer via pin holes using a prior art process was 150 diffusions. With the method of the present invention, the number of random diffusions was zero. Depending upon the particular device being fabricated, this large reduction in unwanted diffusions results in increases in yield of semiconductor pellets in the order of 10%.

What is claimed is:

1. A method of fabricating a semiconductor device comprising:

providing a masking layer on a surface of a semiconductor wafer, said layer having randomly distributed pin holes therein, selectively uncovering a predetermined portion of said surface by removal of said masking layer therefrom, depositing a source of dopant on said masking layer and said predetermined uncovered surface portion, whereby said source is also deposited within said pin holes, selectively removing said source from all portions of said masking layer, including said pin holes, but not from said predetermined uncovered surface portion, and thereafter diffusing said dopant into said wafer from said source remaining on said predetermined uncovered portions.

2. A method of fabricating a semiconductor device as in claim 1 wherein said source of dopant is deposited on said wafer in a manner causing substantially no diffusion of the dopant into said wafer during said deposition step.

3. A method of fabricating a semiconductor device as in claim 2 comprising vapor depositing a doped layer of silicon dioxide on said wafer.

4. A method of fabricating a semiconductor device as in claim 3 comprising thermally growing a masking layer of silicon dioxide on said wafer surface.

5. A method of fabricating a semiconductor device comprising:

thermally growing a masking layer of silicon dioxide on a surface of a semiconductor wafer, selectively etching an opening through said masking layer to uncover a surface portion of said wafer, vapor depositing a doped layer of silicon dioxide on said masking layer and on said uncovered portion and in a manner causing substantially no diffusion of the dopant into said wafer, selectively etching said doped layer from all portions of said masking layer but not from said uncovered portion, and thereafter processing said wafer to cause the dopant in the remaining portion of said doped layer to diffuse into said wafer.

References Cited

UNITED STATES PATENTS

| | | | |
|---|---|---|---|
| 2,975,080 | 3/1961 | Armstrong ---------- | 148—188 |
| 3,364,085 | 1/1968 | Dahlberg ------------ | 148—187 |

L. DEWAYNE RUTLEDGE, *Primary Examiner.*

R. A. LESTER, *Assistant Examiner.*

U.S. Cl. X.R.

148—188, 189